(12) United States Patent
Luo

(10) Patent No.: US 11,600,576 B2
(45) Date of Patent: Mar. 7, 2023

(54) DISPLAY PANEL, ARRAY SUBSTRATE, DISPLAY DEVICE AND METHOD FOR FABRICATING ARRAY SUBSTRATE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/553,365

(22) Filed: Aug. 28, 2019

(65) Prior Publication Data

US 2020/0273815 A1 Aug. 27, 2020

(30) Foreign Application Priority Data

Feb. 21, 2019 (CN) .......................... 201910128929.5

(51) Int. Cl.
  *H01L 23/00* (2006.01)
  *H01L 27/12* (2006.01)
  *H01L 23/427* (2006.01)
  *H01L 23/26* (2006.01)
  *H01L 23/34* (2006.01)

(52) U.S. Cl.
  CPC ............ *H01L 23/562* (2013.01); *H01L 23/26* (2013.01); *H01L 23/345* (2013.01); *H01L 23/427* (2013.01); *H01L 27/1218* (2013.01); *H01L 27/1262* (2013.01)

(58) Field of Classification Search
  CPC ......... H01L 23/00; H01L 23/26; H01L 23/34; H01L 23/427; H01L 27/12; H01L 23/562; H01L 23/345; H01L 27/1218; H01L 27/1262

USPC .......................................................... 257/72
See application file for complete search history.

(56) References Cited

U.S. PATENT DOCUMENTS

| 6,525,792 B1 * | 2/2003 | Fujioka ................ G02B 5/0221 349/113 |
| 2002/0180371 A1 * | 12/2002 | Yamazaki ........... H01L 27/3246 315/169.3 |
| 2006/0007530 A1 * | 1/2006 | Otake ................... G02B 5/201 359/318 |

(Continued)

FOREIGN PATENT DOCUMENTS

| CN | 104037196 A | 9/2014 |
| CN | 106876428 A | 6/2017 |

(Continued)

OTHER PUBLICATIONS

China First Office Action, Application No. 201910128929.5, dated Apr. 30, 2020, 17 pps.: with English translation.

*Primary Examiner* — Sheng-Bai Zhu
(74) *Attorney, Agent, or Firm* — Armstrong Teasdale LLP

(57) ABSTRACT

The disclosure relates to an array substrate and a method for fabricating an array substrate. The array substrate includes a base substrate, a cover layer on the base substrate, an opening at least partially passing through the cover layer, a stress buffer structure adjacent to the opening and on a side of the cover layer facing the base substrate, wherein the stress buffer structure includes a phase change material, wherein a height of a portion of the cover layer on the phase change material is lower than a height of a portion of the cover layer adjacent to the phase change material.

14 Claims, 7 Drawing Sheets

(56) References Cited

U.S. PATENT DOCUMENTS

| | | | | |
|---|---|---|---|---|
| 2006/0290830 | A1* | 12/2006 | Teramoto | G02F 1/133514 349/56 |
| 2008/0105875 | A1* | 5/2008 | Maekawa | H01L 29/78669 257/72 |
| 2014/0323704 | A1* | 10/2014 | Norikane | G03F 7/004 534/843 |
| 2016/0238751 | A1* | 8/2016 | Kanno | G02B 5/0231 |
| 2019/0058160 | A1* | 2/2019 | Kishimoto | H01L 27/3276 |

FOREIGN PATENT DOCUMENTS

| | | |
|---|---|---|
| CN | 108417737 A | 8/2018 |
| CN | 108649058 A | 10/2018 |
| CN | 108695367 A | 10/2018 |
| CN | 109065763 A | 12/2018 |

* cited by examiner

DISPLAY PANEL, ARRAY SUBSTRATE, DISPLAY DEVICE AND METHOD FOR FABRICATING ARRAY SUBSTRATE

CROSS REFERENCE TO RELATED APPLICATIONS

This patent application claims the benefit and priority of Chinese patent application No. 201910128929.5 filed on Feb. 21, 2019, the disclosure of which is incorporated by reference herein in its entirety as part of the present application.

BACKGROUND

This disclosure relates to the field of display technology. In particular, the disclosure relates to an array substrate and a fabricating method thereof.

Displays without frames or with narrow frames are getting more and more attention. Displays without frames or with narrow frames usually include profiled screens and non-profiled screens. The non-profiled screen is to change the screen size of the display, leaving space above or below the screen to set up the camera, earpiece, sensor, and other components. Non-profiled screens are relatively easy to implement. The profiled screen is provided with an opening in the screen to place components such as a camera, an earpiece, a sensor, and the like.

BRIEF DESCRIPTION

Some embodiments of the present disclosure provide an array substrate. The array substrate includes a base substrate, a cover layer on the base substrate, an opening at least partially passing through the cover layer, a stress buffer structure adjacent to the opening and on a side of the cover layer facing the base substrate, wherein the stress buffer structure includes a phase change material, wherein a height of a portion of the cover layer on the phase change material is lower than a height of a portion of the cover layer adjacent to the phase change material.

In some embodiments, the array substrate further includes a groove in the base substrate, wherein the phase change material is disposed in the groove and wherein a top surface of the phase change material is lower than a top surface of the base substrate.

In some embodiments, an orthographic projection area of a top portion of the groove on a top surface of the base substrate is smaller than an orthographic projection area of a bottom portion of the groove on a top surface of the base substrate.

In some embodiments, the stress buffer structure further includes a first barrier on the base substrate and surrounding the phase change material, wherein a height of the phase change material is lower than a height of the first barrier.

In some embodiments, the ratio of the height of the phase change material to the height of the first barrier is in the range of about 0.2~0.5.

In some embodiments, the phase change material includes a solid-liquid phase change material.

In some embodiments, the solid-liquid phase change material includes a photoisomerized material or a thermal phase change material.

In some embodiments, the photoisomerized material includes an azobenzene compound, and wherein the thermal phase change material includes a resin.

In some embodiments, the stress buffer structure further includes a second barrier on a side of the first barrier away from the phase change material and a desiccant between the first barrier and the second barrier.

In some embodiments, at least one of a cross section of the first barrier or a cross section of the second barrier has an inverted trapezoid shape.

In some embodiments, a width of the trapezoid is in a range of about 10 μm~20 μm, and a height of the trapezoid is in a range of about 1 μm~3 μM.

In some embodiments, a distance from the first barrier to the second barrier is in a range of about 0.05 mm~0.1 mm.

In some embodiments, the cover layer includes at least one of a passivation layer or a packaging layer, and wherein the stress buffer structure further includes a protection layer covering the phase change material and the first barrier.

Some embodiments of the disclosure further provide a display panel. The display panel includes the array substrate as described above.

Some embodiments of the present disclosure further provide a display device. The display device includes the display panel as described above.

Some embodiments of the disclosure also provide a method for fabricating an array substrate. The method includes forming a stress buffer structure in a region of the base substrate adjacent to a region to be opened, wherein the stress buffer structure includes a phase change material, forming a cover layer on the region to be opened and on the stress buffer structure, wherein a height of a portion of the cover layer on the phase change material is lower than a height of a portion of the cover layer adjacent to the phase change material, performing a first phase change treatment on the phase change material to change the phase change material from a first phase state to a second phase state, removing a portion of the cover layer corresponding to the region to be opened to form an opening at least partially through the cover layer, and performing a second phase change treatment on the phase change material to change the phase change material from a second phase state to a first phase state.

In some embodiments, the first phase state includes a solid state and the second phase state includes a liquid state.

In some embodiments, the phase change material includes an azobenzene compounds, the first phase change treatment includes an ultraviolet irradiation, and the second phase change treatment includes a visible light irradiation.

In some embodiments, a wavelength of the ultraviolet light is in a range of about 350 nm~400 nm, and a wavelength range of the visible light is in a range of about 500 nm~550 nm.

In some embodiments, the phase change material includes a thermal phase change material, the first phase change treatment includes heating, and the second phase change treatment includes cooling.

In some embodiments, forming the stress buffer structure includes forming a groove in a region of the base substrate adjacent to the region to be opened, and forming the phase change material in the groove, wherein a top surface of the phase change material is lower than a top surface of the base substrate.

In some embodiments, forming a stress buffer structure includes forming the phase change material and a first barrier surrounding the phase change material on the base substrate, wherein a height of the phase change material is lower than a height of the first barrier.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1:
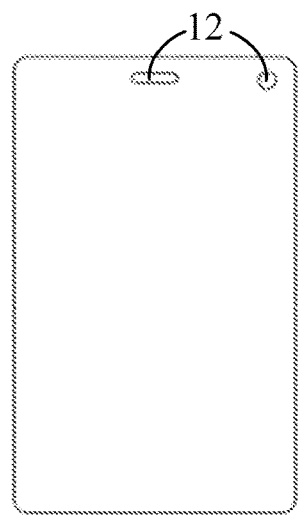
FIG. 1 is a schematic view of a profiled screen according to a relevant technology.

In order to make the technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description, hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "contact" means that a first element, such as a first structure, and a second element, such as a second structure, are connected with or without any intermediary elements at the interface of the two elements.

FIG. 1 shows a schematic view of the profiled screen according to the related technology. As shown in FIG. 1, when the profiled screen is perforated or cut to form the opening 12, cracking easily occurs in a layer that is easily to be cracked such as an inorganic layer in the profiled screen. For example, when perforation is performed by etching, laser sintering, or the like, changes in temperature and stress cause cracking in the inorganic layer in the s profiled screen. The resulting cracking, in turn, may cause external contaminants such as gases to enter the profiled screen, adversely affecting the performance of the profiled screen.

Figure 2:
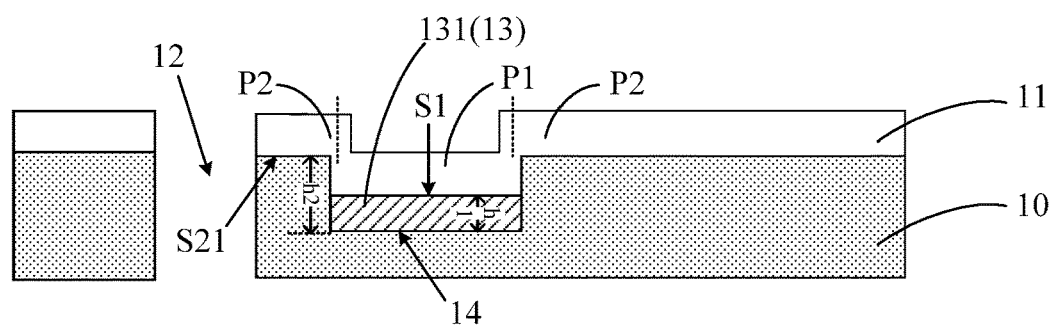
FIG. 2 is a schematic view of an array substrate according to some embodiments of the present disclosure.
Figure 3:
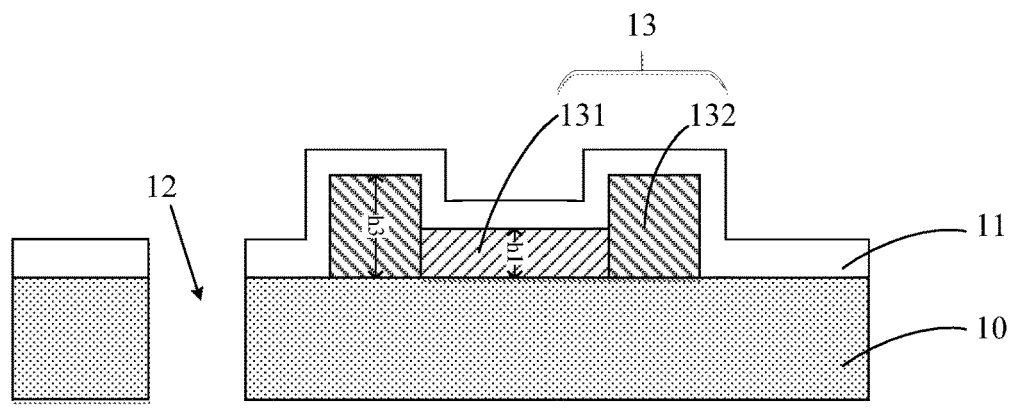
FIG. 3 is a schematic view of a blocking cracking process of an array substrate according to some embodiments of the present disclosure.

FIGS. 2 and 3 are schematic views of an array substrate according to some embodiments of the present disclosure. As shown in FIGS. 2 and 3, an array substrate according to embodiments of the present disclosure includes a base substrate 10, a cover layer 11 on the base substrate 10, an opening 12 at least partially passing through the cover layer 11, a stress buffer structure 13 adjacent to the opening 12 and on a side of the cover layer 11 facing the base substrate. The stress buffer structure 13 includes a phase change material 131. A height of a portion P1 of the cover layer 11 on the phase change material 131 is lower than a height of a portion P2 of the cover layer 11 adjacent to the phase change material. Herein, "at least partially passing through" includes passing through or just partially passing through. In FIGS. 2 and 3, the opening 12 is shown for passing through the cover layer 11 and the base substrate 10 under the cover layer as an example. The opening 12 may also be set to pass through the layer below the cover layer as needed.

Figure 4A:
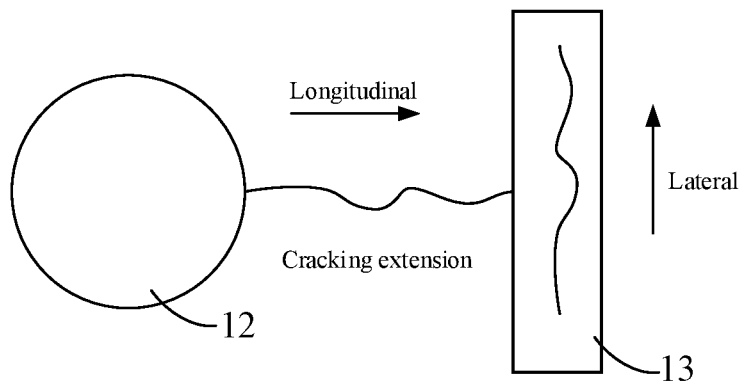
FIG. 4A is a schematic view of the blocking cracking process of an array substrate according to some embodiments of the present disclosure.

FIG. 4A is a schematic view of the blocking cracking process of an array substrate according to some embodiments of the disclosure. As shown in FIG. 4A, when the array substrate is subjected to a perforation or cut process, cracking easily occurs on the cover layer of the array substrate. For example, when perforating by etching, laser sintering or the like, changes in temperature and stress cause cracking in the cover layer. Cracking is more likely to occur especially when the cover layer includes an inorganic material that is more sensitive to changes in temperature and stress. The resulting cracking, in turn, can cause external contaminants such as gases to enter the array substrate, adversely affecting the performance of the array substrate.

As shown in FIG. 4A, a longitudinal cracking extending towards the stress buffer structure 13 occurs in the cover layer when forming the opening 12. When forming the opening, the phase change material of the stress buffer structure can be changed from a solid state to a liquid state. A height of the portion of the cover layer on the liquid phase change material of the stress buffer structure is lower than a height of the portion of the cover layer adjacent to the phase change material. Therefore, when the longitudinal cracking extends to the liquid phase change material of the stress buffer structure, lateral cracking will occur in the cover layer on the liquid phase change material, thereby blocking further extension of the longitudinal cracking. In this way, the quality of the array substrate can be improved.

Figure 4B:
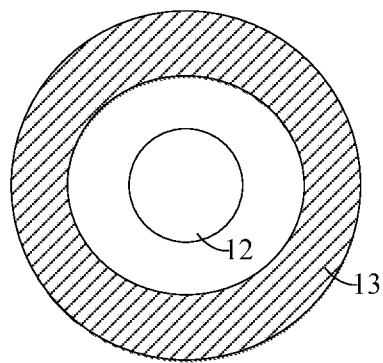
FIG. 4B is a local schematic view of an array substrate according to some embodiments of the present disclosure.

FIG. 4B is a local schematic view of an array substrate according to some embodiments of the present disclosure. As shown in FIG. 4B, the stress buffer structure 13 can be set around the opening 12 to achieve better crack resistance.

According to some embodiments of the present disclosure, the stress buffer structure may be disposed in a non-display area of the array substrate to protect the cover layer of the display area of the array substrate from cracking. The profiled screen typically needs to be subjected to an additional cutting step to obtain a desired shape, and the stress buffer structure can prevent the crack generated when the profiled screen is being cut from extending to the display area of the profiled screen. The array substrate of some embodiments of the present disclosure may also be advantageously applied to a profiled screen structure.

As shown in FIG. 2, the array substrate may further include a groove 14 arranged in the base substrate 10. The phase change material 131 is in the groove 14 and a top surface S1 of the phase change material 131 is lower than a top surface S21 of the base substrate 10.

According to some embodiments of the present disclosure, an orthographic projection area of a top portion of the groove 14 on a top surface of the base substrate 10 is smaller than an orthographic projection area of a bottom portion of the groove 14 on a top surface of the base substrate 10. With such an arrangement, the portion P1 of the cover layer on the phase change material 131 may be more easily cracked, thereby making it easier to block the extension of the longitudinal crack.

According to some embodiments of the present disclosure, a ratio of a height h1 of the phase change material 131 to a distance h2 from the top surface of the base substrate to a bottom of the groove is in the range of about 0.2~0.5. Such arrangement can further facilitate the formation of lateral cracking, thereby it is advantageous to block the extension of the longitudinal crack.

According to some embodiments of the present disclosure, as shown in FIG. 3, the stress buffer structure 13 further includes a first barrier 132 on the base substrate 10 and surrounding the phase change material 131, wherein a height of the phase change material 131 is lower than a height of the first barrier 132. As shown in FIG. 3, the first barrier member 132 can be positioned on both sides of the phase change material 131 to prevent the phase change material from flowing during the perforation or cutting process.

In some embodiments, the ratio of the height h1 of the phase change material 131 to the height h3 of the first barrier 132 can be in the range of about 0.2~0.5 to achieve a better crack resistance effect.

According to some embodiments of the present disclosure, the phase change material may include a solid-liquid phase change material. When perforating or cutting treatment, the phase change material becomes liquid, the stress caused by the treatment can be better released to facilitate the formation of lateral cracks. The solid-liquid phase change material may include a photoisomerized material or a thermal phase change material.

The photoisomerized materials may include an azobenzene compound. Under the UV irradiation, the azobenzene compound may be changed from a solid state to a liquid state. Under a visible light irradiation, the azobenzene compound may change from a liquid state to a solid state under irradiation with. Azobenzene compounds include, but are not limited to, 2,4-dichloro-6-azophenoxy-1,3,5-s-triazine, 2-dichloro-4,6-azophenoxy-1,3,5-s-triazine, 2-chloro-4, 6-diazophenoxy-1,3,5-s-triazine, 2,4,6-triazophenoxy-1,3 5-s-triazine.

Thermal phase change materials can include a resin. For example, the resin may include a low melting point resin with a melting point between 40° C. and 90° C. Low melting point resins include at least one of the following: paraffin wax, silicon wax, and microcrystal wax. According to the embodiments of the disclosure, thermal conductive material, such as alumina, zinc oxide, boron nitride, aluminum nitride, silicon nitride, silicon carbide, aluminum powder, copper powder, silver powder, graphite, and other thermal conductive materials, may also be added to the thermal phase change material to achieve better phase transformation effect. The thermal conductive material may be particles. The diameter of particles may be between 0.1 μm~5 μm. The thermally conductive material may be about 30%~50% of the total volume ratio of the thermal phase change material. Alternatively, an anti-resin oxidant, such as 2,2-methylenebis(4-methyl-6-tert-butylphenol) or 2,6-tributyl-4-methylphenol, and a coupling agent, such as tetra-n-butyl isophthalate and isopropyl triisostearoyl titanate, may be added.

Figure 5:
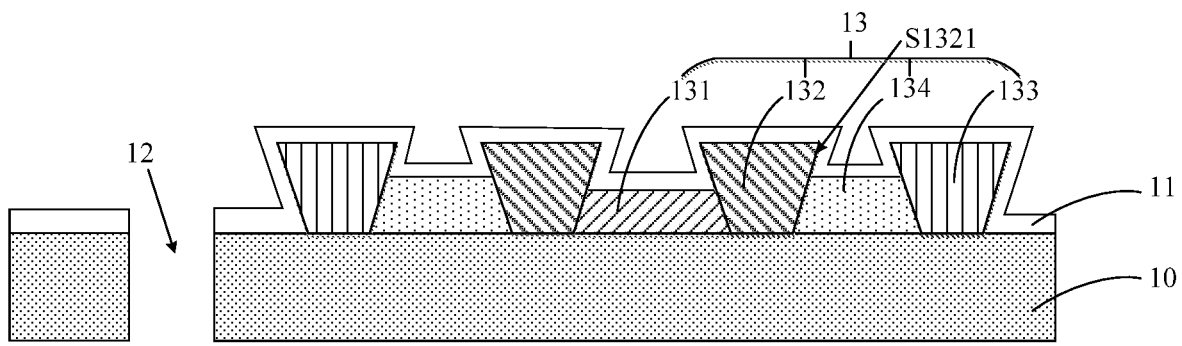
FIG. 5 is a schematic view of an array substrate according to some embodiments of the present disclosure.

FIG. 5 is a schematic view of an array substrate according to some embodiments of the present disclosure. As shown in FIG. 5, the stress buffer structure may further include a second barrier 132 on a side S1321 of the first barrier 132 away from the phase change material and a desiccant 134 between the first barrier 132 and the second barrier 133. The desiccants can be used to absorb water vapor.

At least one of a cross section of the first barrier 132 or a cross section of the second barrier 133 has an inverted trapezoid shape. The inverted trapezoid here refers to the situation where the long side of the trapezoid is on the top and the short side is on the lower side. With such an arrangement, the portion P1 of the cover layer disposed on the phase change material 131 is more likely to occur lateral cracking, thereby making it easier to block the longitudinal extension of the crack.

In some embodiments, the width of the trapezoid may range from about 10 μm to 20 μm. The width of the trapezoid herein refers to the length of the long side of the trapezoid. The height can range from about 1 μm to 3 μm. The distance from the first barrier to the second barrier may range from about 0.05 mm to 0.1 mm. The distance from the first barrier to the second barrier herein refers to the minimum distance from any point on the first barrier to any point on the second barrier.

Figure 6:
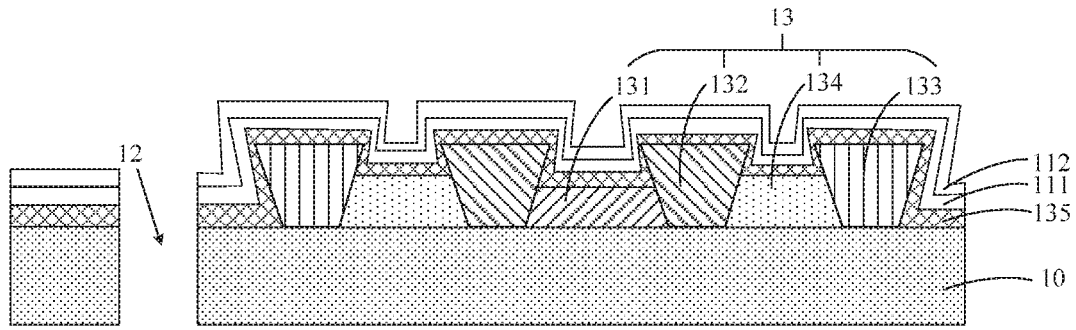
FIG. 6 is a schematic view of an array substrate according to some embodiments of the present disclosure.

FIG. 6 is a schematic view of an array substrate according to some embodiments of the present disclosure. As shown in FIG. 6, the cover layer 11 may include at least one of a passivation layer 111 or a packaging layer 112. The packaging layer 112 may be arranged on the passivation layer 111. The stress buffer structure may also include a protection layer 135 covering the phase change material 131 and the first barrier 132. The material of protection layer 135 may include low temperature inorganic material. That is to say, the protection layer 135 may be formed at a relatively low temperature to reduce the adverse effect on the film under the protection layer when the protection layer is formed.

Embodiments of the present disclosure also provide a method for fabricating an array substrate as described above.

Figure 7:
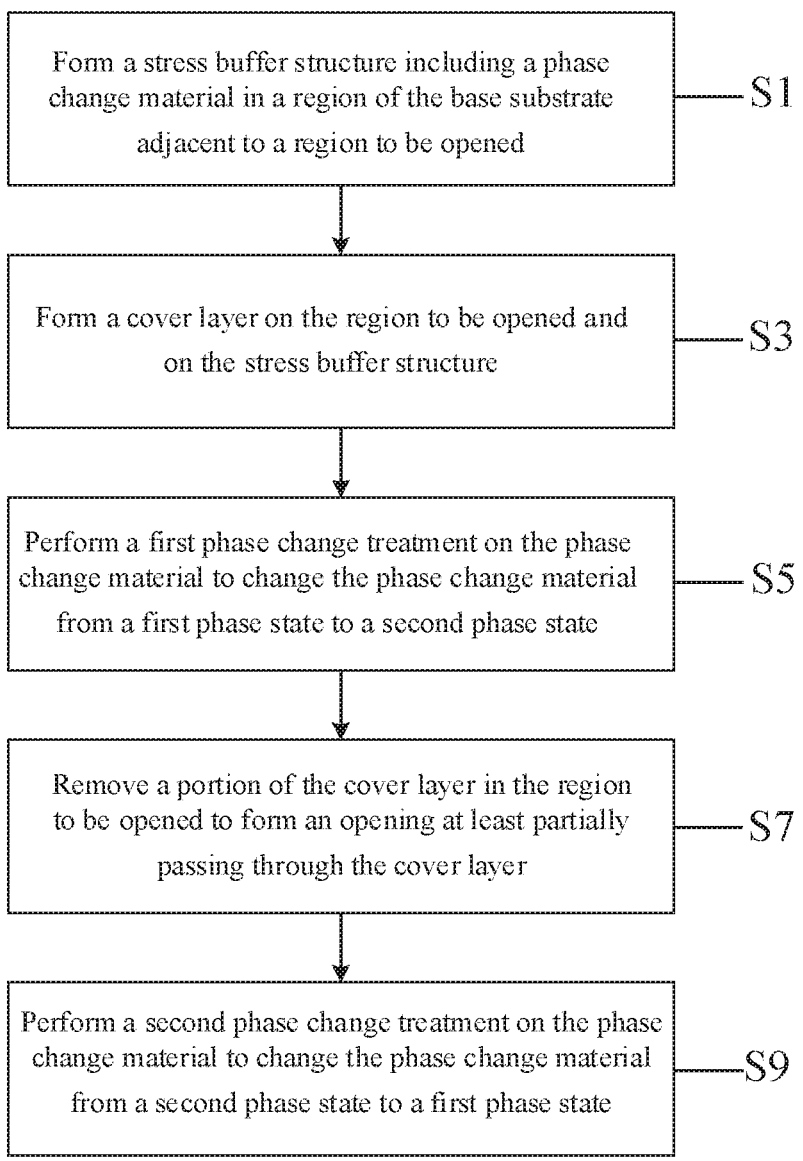
FIG. 7 is a schematic view of a method for fabricating an array substrate according to some embodiments of the present disclosure.

FIG. 7 is a schematic view of a method for fabricating an array substrate according to some embodiments of the present disclosure. As shown in FIG. 7, the method includes:

S1. Forming a stress buffer structure in a region of the base substrate adjacent to a region to be opened, wherein the stress buffer structure includes a phase change material.

S3. Forming a cover layer on the region to be opened and on the stress buffer structure.

S5. Performing a first phase change treatment on the phase change material to change the phase change material from a first phase state to a second phase state.

S7. Removing a portion of the cover layer in the region to be opened to form an opening at least partially passing through the cover layer.

S9. Performing a second phase change treatment on the phase change material to change the phase change material from a second phase state to a first phase state.

In some embodiments, forming the stress buffer structure includes forming a groove in a region of the base substrate adjacent to the region to be opened, and forming the phase change material in the groove, wherein a top surface of the phase change material is lower than a top surface of the base substrate.

Figure 10A:
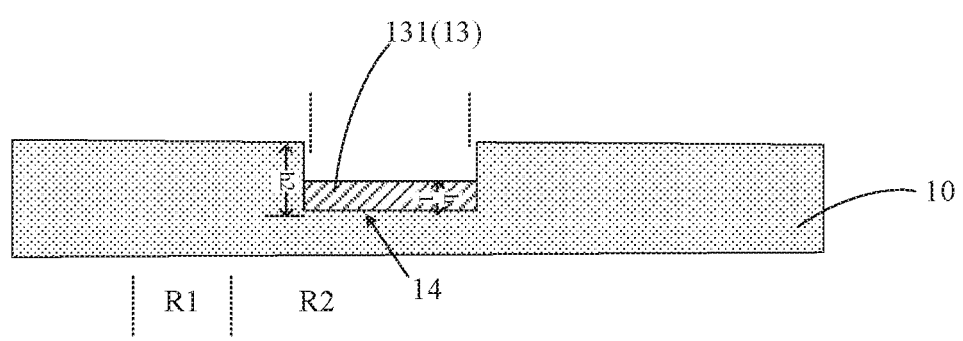
FIGS. 10A-10E are schematic views of a method for fabricating an array substrate according to some embodiments of the present disclosure.

FIGS. 10A-10E are schematic views of a method for fabricating an array substrate according to an embodiment of the present disclosure. As shown in FIGS. 10A-10E, the method includes:

As shown in FIG. 10A, forming grooves 14 in the region R2 of the base substrate 10 adjacent to the region R1 to be opened, and forming the phase change material 131 in the grooves 14, where the top surface of the phase change material 131 is lower than the top surface of the substrate 10.

Figure 10B:
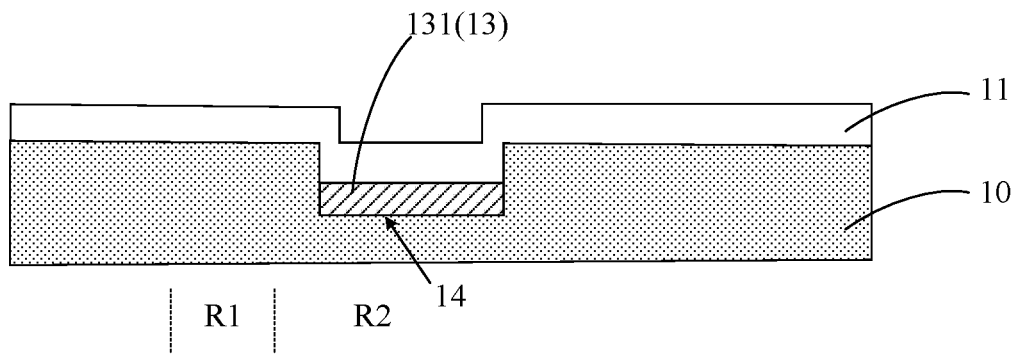

As shown in FIG. 10B, forming a cover layer 11 on the region R1 to be opened and on the stress buffer structure 13.

Figure 10C:
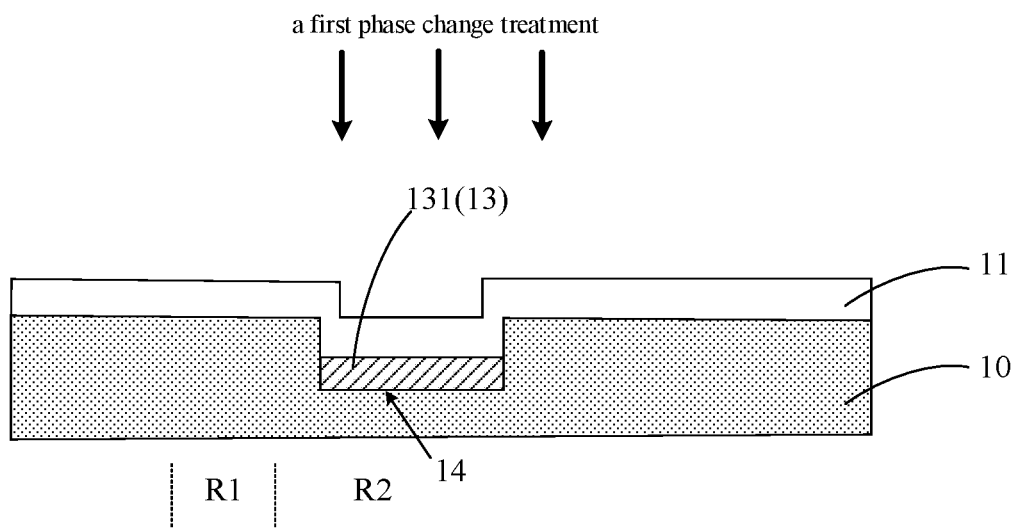

As shown in FIG. 10C, performing a first phase change treatment on the phase change material 131 to change the phase change material from a first phase state to a second phase state.

Figure 10D:
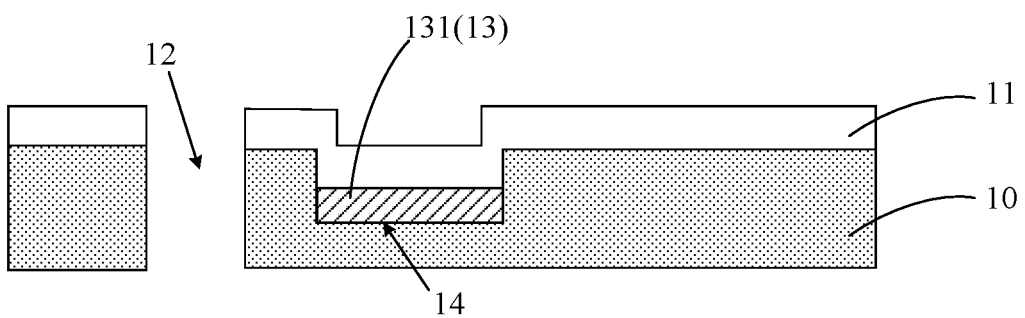
Figure 10E:
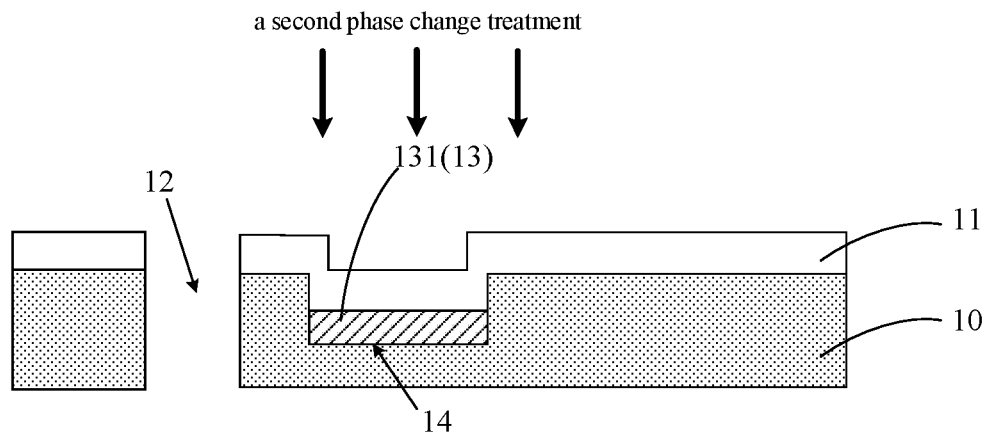

As shown in FIG. 10D, removing a portion of the cover layer in the region to be opened to form an opening at least partially passing through the cover layer;

As shown in FIG. 10E, performing a second phase change treatment on the phase change material to change the phase change material from a second phase state to a first phase state.

In some embodiments, forming a stress buffer structure includes forming the phase change material and a first barrier surrounding the phase change material on the base substrate, wherein a height of the phase change material is lower than a height of the first barrier.

Figure 11A:
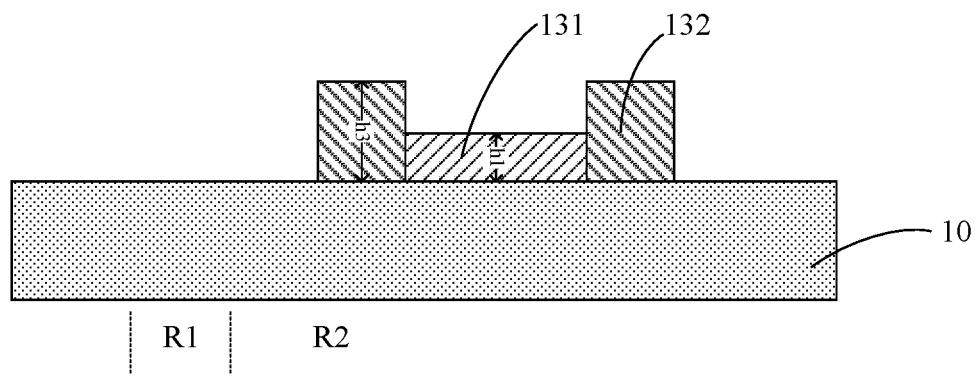
FIGS. 11A-11E are schematic views of a method for fabricating an array substrate according to some embodiments of the present disclosure.
Figure 11B:
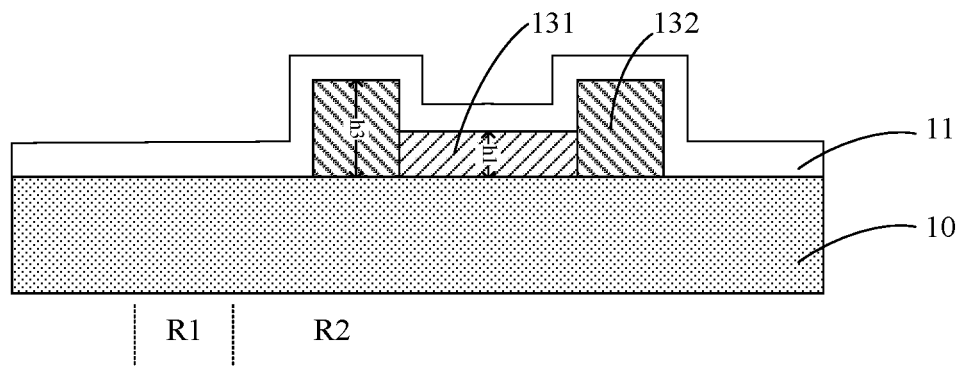
Figure 11C:
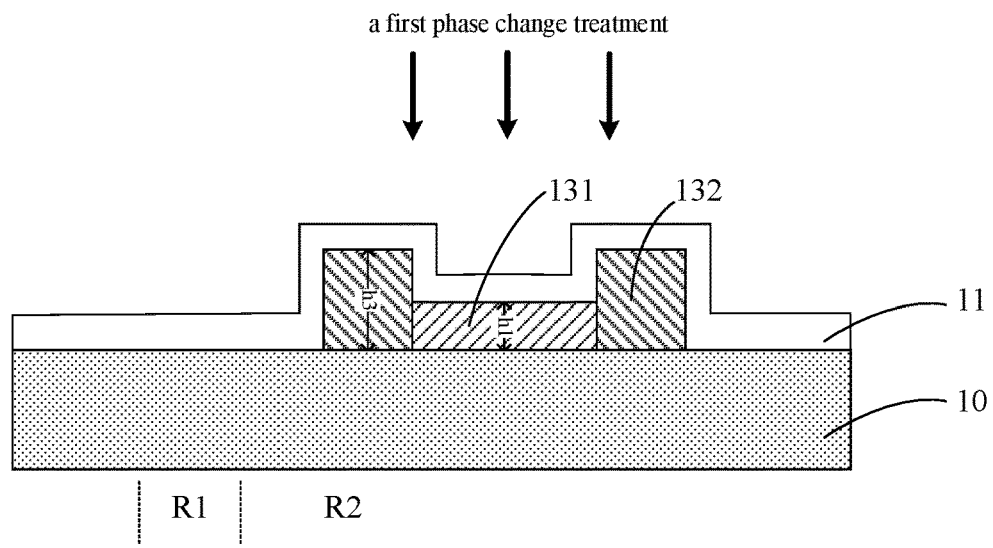
Figure 11D:
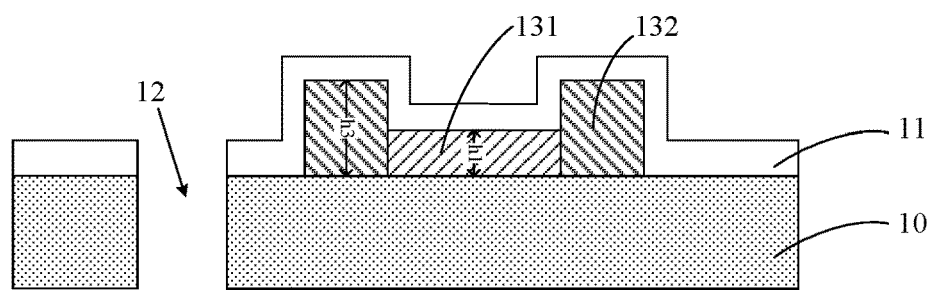
Figure 11E:
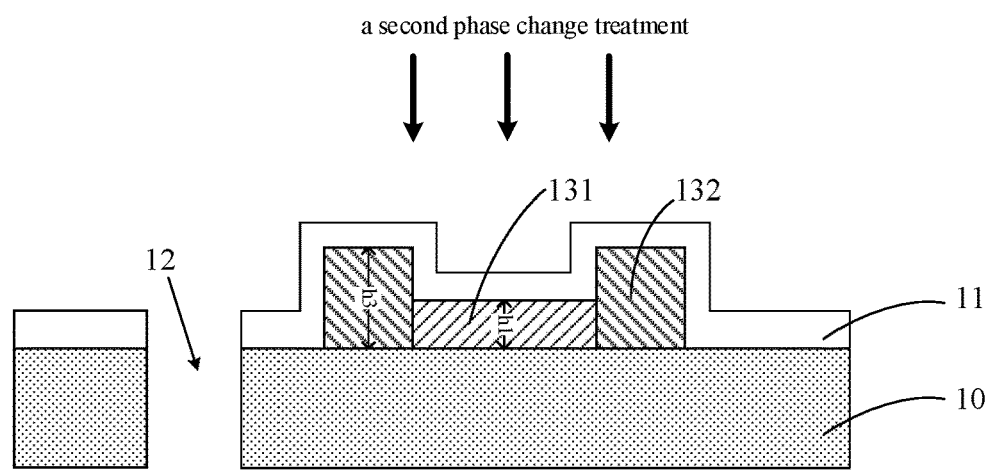

FIGS. 11A-11E are schematic views of a method for fabricating an array substrate according to some embodiments of the present disclosure. As shown in FIGS. 11A-11E, the method includes: as shown in FIG. 11A, forming the phase change material 131 and a first barrier 132 surrounding the phase change material 131 on the base substrate 10, wherein a height h1 of the phase change material 131 is lower than a height h2 of the first barrier, as shown in FIG. 11B, forming a covering layer 11 on the region R1 to be opened and on the stress buffer structure 13, as shown in FIG. 11C, performing a first phase change treatment on the phase change material 131 to change the phase change material from a first phase state to a second phase state, as shown in FIG. 11D, removing a portion of the cover layer 11 in the region to be opened to form an opening 12 at least partially passing through the cover layer, and as shown in FIG. 11E, performing a second phase change treatment on the phase change material to change the phase change material from a second phase state to a first phase state.

The first phase state may include a solid state, and the second phase state may include a liquid state. When the phase change material is in liquid state, it can better release the stress from the opening and prevent the stress from spreading. Phase change materials may include photoisomerized materials or thermal phase change materials.

In some embodiments, phase change material may include an azobenzene compound. In this case, the first phase change treatment includes an ultraviolet irradiation and the second phase change treatment includes a visible light irradiation.

For example, before the opening is formed, a phase change material including an azobenzene compound may be irradiated with ultraviolet light having a wavelength of between about 350 nm and 400 nm. Under such ultraviolet light irradiation, the azobenzene compound may be converted from a solid state to a liquid state. The liquid azobenzene compound is more likely to release the stress generated when the opening is formed, thereby facilitating the formation of longitudinal cracking that blocks lateral cracking. After the opening is formed, the phase change material including the azobenzene compound may be irradiated with visible light having a wavelength between about 500 nm and 550 nm. Under such irradiation of visible light, the liquid azobenzene compound will change from a liquid state to a solid state to form a stable structure.

In some embodiments, phase change materials may include thermal phase change materials. In this situation, the first phase change treatment includes heating and the second phase change treatment includes cooling.

Thermal phase change materials may include resins and thermal conductive materials. Specifically, a phase change material including 30% alumina and 70% paraffin wax may be used. For example, the phase change material may be heated to 60° C. prior to forming the opening such that the phase change material changes from a solid to a liquid. After the opening is formed, the phase change material changes from a liquid state to a solid state because the phase change material is cooled below the melting point. "Cooling" herein may include the use of a specific cooling process, and may also include stopping the heating.

Figure 8:
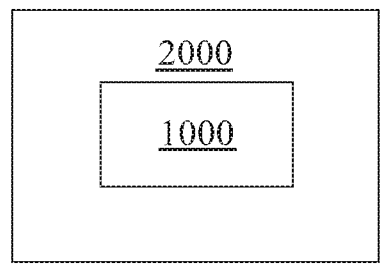
FIG. 8 is a schematic view of a display panel according to some embodiments of the present disclosure.

Some embodiments of the present disclosure also provide a display panel including an array substrate as described above. FIG. 8 is a schematic view of a display panel according to some embodiments of the present disclosure. As shown in FIG. 8, a display panel 2000 according to an embodiment of the present disclosure may include an array substrate 1000. The array substrate 1000 may include the array substrate shown in FIGS. 2, 4B, 5, and 6.

Figure 9:
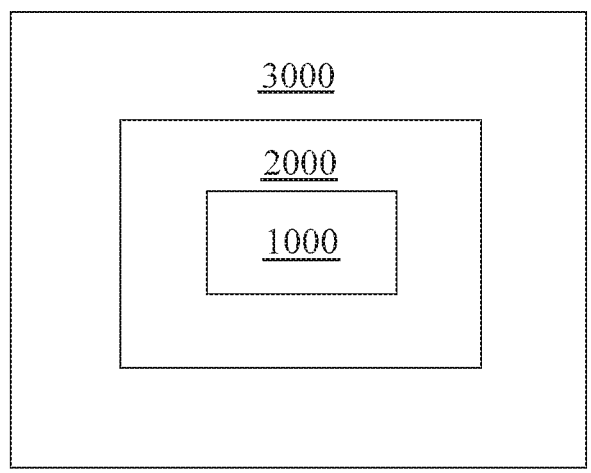
FIG. 9 is a schematic view of a display device according to some embodiments of the present disclosure.

Embodiments of the present disclosure also provide a display device including a display panel as described above. FIG. 9 is a schematic view of a display device according to an embodiment of the present disclosure. As shown in FIG. 9, a display device 3000 according to an embodiment of the present disclosure may include a display panel 2000. The display panel 2000 may include the display panel shown in FIG. 8.

The specific embodiments have been described, and are not intended to limit the scope of the disclosure. In fact, the novel embodiments described herein can be implemented in a variety of other forms. In addition, various omissions, substitutions, and changes in the form of the embodiments described herein may be made without departing from the spirit of the disclosure. The following claims and their equivalents are intended to cover such forms or modifications that fall within the scope and spirit of the disclosure.

What is claimed is:

1. An array substrate comprising:
   a base substrate;
   a cover layer on the base substrate;
   an opening completely passing through the cover layer;
   a stress buffer structure adjacent to the opening and on a side of the cover layer facing the base substrate and configured to protect the cover layer from cracking when forming the opening, wherein the stress buffer structure comprises a phase change material, wherein a height of a portion of the cover layer on the phase change material is lower than a height of a portion of the cover layer adjacent to the phase change material, and wherein the phase change material comprises a solid-liquid phase change material,
   wherein before the opening is formed, the phase change material is in a solid state; and wherein when forming the opening, the phase change material is changed from the solid state to a liquid state;

a groove in the base substrate, wherein the phase change material is disposed in the groove, and wherein a top surface of the phase change material is lower than a top surface of the base substrate, wherein the cover layer comprises a passivation layer and a packaging layer disposed on a side of the passivation layer.

2. The array substrate according to claim 1, wherein an orthographic projection area of a top portion of the groove on the top surface of the base substrate is smaller than an orthographic projection area of a bottom portion of the groove on the top surface of the base substrate.

3. The array substrate according to claim 1, wherein the stress buffer structure further comprises a first barrier on the base substrate and surrounding the phase change material, and wherein a height of the phase change material is lower than a height of the first barrier.

4. The array substrate according to claim 1, wherein the solid-liquid phase change material comprises one of a photoisomerized material and a thermal phase change material.

5. The array substrate according to claim 4, wherein the photoisomerized material comprises an azobenzene compound, and wherein the thermal phase change material comprises a resin.

6. The array substrate according to claim 3, wherein the stress buffer structure further comprises a second barrier on a side of the first barrier away from the phase change material and a desiccant between the first barrier and the second barrier.

7. The array substrate according to claim 6, wherein at least one of a cross section of the first barrier or a cross section of the second barrier has an inverted trapezoid shape.

8. The array substrate according to claim 7, wherein the stress buffer structure further comprises a protection layer covering the phase change material and the first barrier.

9. A display panel comprising the array substrate according to claim 1.

10. A display device comprising the display panel according to claim 9.

11. A method for fabricating an array substrate comprising:

forming a stress buffer structure in a region of a base substrate adjacent to a region to be opened and configured to protect a cover layer to be formed on the base substrate from cracking when forming an opening completely passing through the cover layer in the region to be opened, wherein the stress buffer structure comprises a phase change material, wherein forming the stress buffer structure comprises forming a groove in a region of the base substrate adjacent to the region to be opened, and forming the phase change material in the groove, and wherein a top surface of the phase change material is lower than a top surface of the base substrate;

forming the cover layer on the region to be opened and on the stress buffer structure, wherein a height of a portion of the cover layer on the phase change material is lower than a height of a portion of the cover layer adjacent to the phase change material;

performing a first phase change treatment on the phase change material to change the phase change material from a solid state to a liquid state;

removing a portion of the cover layer in the region to be opened to form the opening; and performing a second phase change treatment on the phase change material to change the phase change material from the liquid state to the solid state.

12. The method according to claim 11, wherein the phase change material includes an azobenzene compound, wherein the first phase change treatment includes an ultraviolet light irradiation, and wherein the second phase change treatment includes a visible light irradiation.

13. The method according to claim 11, wherein the phase change material comprises a thermal phase change material, wherein the first phase change treatment comprises heating, and wherein the second phase change treatment comprises cooling.

14. The method according to claim 11, wherein forming the stress buffer structure comprises forming the phase change material and a first barrier surrounding the phase change material on the base substrate, and wherein a height of the phase change material is lower than a height of the first barrier.

* * * * *

UNITED STATES PATENT AND TRADEMARK OFFICE
CERTIFICATE OF CORRECTION

PATENT NO. : 11,600,576 B2
APPLICATION NO. : 16/553365
DATED : March 7, 2023
INVENTOR(S) : Chengyuan Luo It is certified that error appears in the above-identified patent and that said Letters Patent is hereby corrected as shown below:

In the Specification

Column 2, Line 10, delete "about 1 μm~3 μM" and insert therefor -- about 1 μm~3 μm --.

Signed and Sealed this
Second Day of May, 2023

Katherine Kelly Vidal
*Director of the United States Patent and Trademark Office*